United States Patent
Murayama et al.

(10) Patent No.: US 6,281,567 B1
(45) Date of Patent: Aug. 28, 2001

(54) SUBSTRATE FOR MOUNTING SEMICONDUCTOR CHIP WITH PARALLEL CONDUCTIVE LINES

(75) Inventors: Kei Murayama; Mitsutoshi Higashi, both of Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 09/333,515

(22) Filed: Jun. 15, 1999

(30) Foreign Application Priority Data

Jun. 16, 1998 (JP) .................................................. 10-167840

(51) Int. Cl.⁷ .................................................. H01L 21/66
(52) U.S. Cl. .......................... 257/676; 257/684; 257/700; 257/731; 257/781; 257/783
(58) Field of Search ..................... 257/673, 688, 257/700, 783, 676, 684, 731, 782

(56) References Cited

U.S. PATENT DOCUMENTS

| 4,744,850 | 5/1988 | Imano et al. |
| 5,729,049 | * 3/1998 | Corisis et al. ........................ 257/783 |
| 5,753,970 | * 5/1998 | Rostoker ............................... 257/783 |
| 5,759,910 | 6/1998 | Mangold et al. |
| 6,077,382 | * 6/2000 | Watanebe .............................. 156/322 |

FOREIGN PATENT DOCUMENTS

| 0 516 402 | 12/1992 | (EP) . |
| 1-298731 | 12/1989 | (JP) . |
| 8-195548 | 7/1996 | (JP) . |
| 08195548 | * 7/1996 | (JP) ..................................... 257/787 |
| 8-222571 | 8/1996 | (JP) . |
| 9-219579 | 8/1997 | (JP) . |
| 0 821 408 | 1/1998 | (JP) . |
| 11145328 | * 5/1999 | (JP) ..................................... 257/787 |

OTHER PUBLICATIONS

Patent Abstracts of Japan, vol. 1999, No. 10, Aug. 31, 1999 & JP 11 145328 A (Fujitsu Limted), May 28, 1999.

* cited by examiner

*Primary Examiner*—Fetsum Abraham
(74) *Attorney, Agent, or Firm*—Staas & Halsey LLP

(57) ABSTRACT

A substrate for mounting a semiconductor chip to be bonded to a surface of the substrate via a resin adhesive, such as an anisotropic conductive film. The substrate includes a substrate body having a semiconductor chip mounting surface and a plurality of conductive lines arranged on the surface extending in a lengthwise direction and spaced substantially in parallel to one another by a predetermined pitch. Each of the conductive lines defines, by a part thereof, a pad portion, a width of which is larger than that of the conductive line, to which a respective electrode of the semiconductor chip is to be electrically connected. Each pad portion has a first end and a second opposite end, with respect to a lengthwise direction thereof. The plurality of pad portions is arranged with a first end of one pad portion and a second end of an adjacent pad portion arranged in the vicinity of each other in a widthwise direction.

4 Claims, 3 Drawing Sheets

SUBSTRATE FOR MOUNTING SEMICONDUCTOR CHIP WITH PARALLEL CONDUCTIVE LINES

BACKGROUND OF THE INVENTION

1. Field of the Invention

The present invention relates to a substrate for mounting a semiconductor chip wherein the semiconductor chip is bonded to a surface of the substrate via a resin. The present invention also relates to a semiconductor device using such a substrate.

2. Description of the Related Art

In the prior art, as shown in FIGS. 2 and 3, a semiconductor chip 20 is mounted onto a substrate body 10 made of a ceramic or a resin via a resin of an ACF 30.

The ACF 30 is formed of thermosetting resin such as epoxy resin or thermoplastic resin such as polyethylene. If the ACF 30 is composed of thermosettable resin, the semiconductor chip 20 could be bonded onto a surface of the substrate body 10 via the thermosettable resin of the ACF 30 which is heated to be cured. On the other hand, if the ACF 30 is composed of thermoplastic resin, the semiconductor chip 20 could be bonded onto a surface of the substrate body 10 via the thermoplastic resin of the ACF 30 which is heated and then cooled to be hardened.

Together therewith, conductor bumps 22 such as Au bumps or others formed on a plurality of electrodes orderly arranged on a surface of the semiconductor chip 20 are electrically connected to a plurality of conductor pads 50 provided on a surface of the substrate body 10 at positions corresponding to the respective conductor bumps by the metallization or the etching of copper foil, via conductive particles (not shown) contained in the resin of the ACF 30.

Thus, the semiconductor chip 20 is surface-mounted onto the substrate via the resin of the ACF 30.

In this regard, ACF stands for "anisotropic conductive film" which contains conductive particles in the resin thereof. When the semiconductor chip is surface-mounted onto the substrate as described above, the conductive particles contained in the ACF resin are interposed between the conductor bump formed on the electrode of the semiconductor chip and the conductor pad formed on the surface of the substrate body. Thus, the electro-conductivity is imparted to a portion of the ACF interposed between the conductor bump on the semiconductor chip and the conductor pad on the substrate body, whereby the conductor bump of the semiconductor chip is electrically connected with the conductor pad on the surface of the substrate body via the conductive particles contained in that portion of the ACF.

The plurality of electrodes on the semiconductor chip 20 is arranged at a predetermined pitch on the surface of the semiconductor chip 20 on which integrated circuits are formed. Accordingly, the plurality of conductor pads 50 for electrically connecting the electrodes is formed on the surface of the substrate body 10 on which the semiconductor chip 20 is mounted at a predetermined pitch in correspondence to the arrangement of the electrodes.

As shown in FIG. 3, the above-mentioned conductor pad 50 is shaped to be widened strips extending in the lengthwise direction, so that the conductor bump 22 can be electrically connected to the corresponding conductor pad 50 in a reliable manner, even if a position of the conductor bump 22 is somewhat deviated from the aimed one in the lengthwise or widthwise direction of the conductor pads 50 for some reason, which conductor bumps are formed on the electrode of the semiconductor chip 20 to be electrically connected to the conductor pads 50 via the conductive particles contained in the resin of the ACF 30.

For this purpose, the plurality of conductor pads 50 of widened strip-shape is arranged on the surface of the substrate body 10 on which the semiconductor chip 20 is to be mounted, so that a narrow gap 52 having a length corresponding to that of the conductor pad 50 is defined between every adjacent conductor pad 50.

According to the above-mentioned substrate for mounting a semiconductor chip, however, voids are liable to generate anywhere in the resin of the ACF 30 when the semiconductor chip 20 is bonded to the surface of the substrate body 10 via the resin of the ACF 30, which deteriorates the adhesion of the ACF resin and results in the stripping-off of the semiconductor chip 20 from the surface of the substrate body 10 on which the semiconductor chip is mounted via the resin of the ACF 30. Thus, a favorable electrical connection is deteriorated between the conductor bumps 22 formed on the electrodes of the semiconductor chip 20 and the conductor pads 50 formed on the surface of the substrate body 10 connected to each other via the electro-conductive particles contained in the resin of the ACF 30.

A cause of the above-mentioned voids generated anywhere in the resin of the ACF 30 is that gas generating from the resin of the ACF 30 during the heating thereof cannot smoothly pass through the narrow gap 52, between the adjacent conductor pads 50 arranged on the surface of the substrate body 10, in parallel to each other, and having a length equal to the longitudinal length of the conductor pad 50, but a large proportion of the gas continues to dwell in the interior of the resin of the ACF 30 disposed inward of the conductor pad 50 and softened by heating.

Similarly, air left in a gap between complicatedly combined connection lines 12 and/or adhered on a stepped side surface thereof expands by the heating, which cannot smoothly pass through the narrow gap 52, between the adjacent conductor pads 50 arranged on the surface of the substrate body 10 in parallel to each other, but a large proportion of the air continues to dwell in the interior of the resin of the ACF 30 disposed inward of the conductor pad 50 and softened by heating.

Particularly, if the ACF 30 is composed of a quick-curing resin, a heating time necessary for bonding the semiconductor chip 20 to the surface of the substrate body 10 via the resin of the ACF 30 is considerably short, for example, in a range from 20 to 60 seconds, whereby almost all the above-mentioned gas and/or air remains in the interior of the resin of the ACF 30, resulting in the voids anywhere in the resin of the ACF 30.

These are also true of a substrate wherein the conductor bumps 22 formed on the electrodes provided on the surface of the semiconductor chip 20 are electrically connected directly to the conductor pads 50 formed on the surface of the substrate body 10 whilst an underfill (not shown) composed of thermosettable resin or thermoplastic resin is filled in a gap between the semiconductor chip 20 and the substrate body 10 to bond the semiconductor chip 20 onto the surface of the substrate body 10.

That is, in such a substrate, when the underfill composed of thermosettable resin or thermoplastic resin is heated, gas generated from the underfill or air left in the interior of the underfill and expanding during the heating could not smoothly pass through the long narrow gap 52 without resistance between every adjacent conductor pads 50 arranged on the surface of the substrate body 10 in parallel to each other, but a large proportion of the gas and/or air continue to dwell in the interior of the resin of the underfill disposed inward of the conductor pad 50 and softened by heating. This causes voids anywhere in the underfill resin, which results in the deterioration of adhesion of the underfill resin whereby the semiconductor chip 20 is easily stripped off from the surface of the substrate body 10.

Accordingly, in the substrate wherein the semiconductor chip 20 is bonded to the surface of the substrate body 10 via the underfill resin, it has been impossible to maintain a favorable electrical connection between the conductor bump 22 formed on the electrode of the semiconductor chip 20 and the conductor pad 50 formed on the surface of the substrate body 10.

SUMMARY OF THE INVENTION

An object of the present invention is to solve the above-mentioned problems in the prior art and to provide a substrate for mounting a semiconductor chip (hereinafter referred merely to "substrate") capable of preventing voids from being generated in ACF or underfill resin during the bonding of the semiconductor chip to a surface of a substrate body and thus preventing the semiconductor chip from being stripped off from the surface of the substrate body.

According to the present invention, there is provided a substrate for mounting a semiconductor chip which is to be bonded to a surface of said substrate via a resin, said substrate comprising: a substrate body having a semiconductor chip mounting surface; a plurality of conductive lines arranged on said surface so as to extend in a lengthwise direction and spaced substantially in parallel to one another by a predetermined pitch; each of said conductive lines defining, by a part thereof, a pad portion, a width of which is larger than that of said conductive line, to which a respective electrode of said semiconductor chip is to be electrically connected; said pad portion having-first and second ends with respect to a lengthwise direction thereof; and said plurality of pad portions being arranged in such a manner that one end of one pad portion and the other end of an adjacent pad portion are arranged in the vicinity to each other in a widthwise direction.

In this substrate, the conductor pads shaped to be widened strips and arranged in parallel to each other on the surface of the substrate body are alternately shifted in the lengthwise direction of the conductor pad.

Thereby, two adjacent conductor pads are overlapped with each other as seen in the widthwise direction by a distance much shorter than a half of the longitudinal length of the conductor pad. This means that a length of the narrow gap between the adjacent two conductor pads also becomes much shorter than a half of the longitudinal length of the conductor pad. The shorter gap allows the gas generated when the resin is heated to smoothly pass therethrough with less resistance. Similarly, air or others left in the interior of the resin and expanding during the heating is also allowed to smoothly pass through the shortened narrow gap.

The conductor pads shaped to be widened strips are alternately shifted in the lengthwise direction of the conductor pad, so that one end portion of one of two adjacent conductor pads is overlapped with the other end portion of the other conductor pad as seen in the widthwise direction of the conductor pad by a distance larger than the width of the conductor bump.

Thereby, it is possible to electrically connect, in a reliable manner, the conductor bump formed on the respective electrode arranged on the surface of the semiconductor chip to the end portion of the conductor pad overlapped with the adjacent one as seen in the widthwise direction of the conductor pad, so that the conductor bump is not off of the conductor pad.

According to another aspect of the present invention, there is provided a semiconductor device comprising: a semiconductor chip having a plurality of electrodes arranged by a predetermined pitch; and a substrate for mounting thereon said semiconductor chip by means of a resin adhesive; said substrate comprising:

a substrate body having a semiconductor chip mounting surface; a plurality of conductive lines arranged on said surface so as to extend in a lengthwise direction and spaced substantially in parallel to one another by said predetermined pitch; each of said conductive lines defining, by a part thereof, a pad portion, a width of which is larger than that of said conductive line, to which a respective electrode of said semiconductor chip is to be electrically connected; said pad portion having one and the other ends thereof with respect to a lengthwise direction thereof; and said plurality of pad portions being arranged in such a manner that one end of one pad portion and the other end of an adjacent pad portion are arranged in the vicinity to each other in a widthwise direction.

The resin adhesive is preferably of an ACF type. According to such a structure, since a narrow gap between portions of two adjacent conductor pads shaped to be widened strips and overlapped with each other as seen in the widthwise direction of the conductor chip has a length much shorter than a half of the longitudinal length of the conductor pad, gas generated when the ACF resin is heated is allowed to smoothly pass therethrough with less resistance. Similarly, air or others left in the interior of the resin and expanding during the heating is also allowed to smoothly pass through the shortened narrow gap with less resistance.

BRIEF DESCRIPTION OF THE DRAWINGS

The present invention will be described in more detail below with reference to the preferred embodiments illustrated in the attached drawings.

DETAILED DESCRIPTION OF THE EMBODIMENTS

Figure 1:
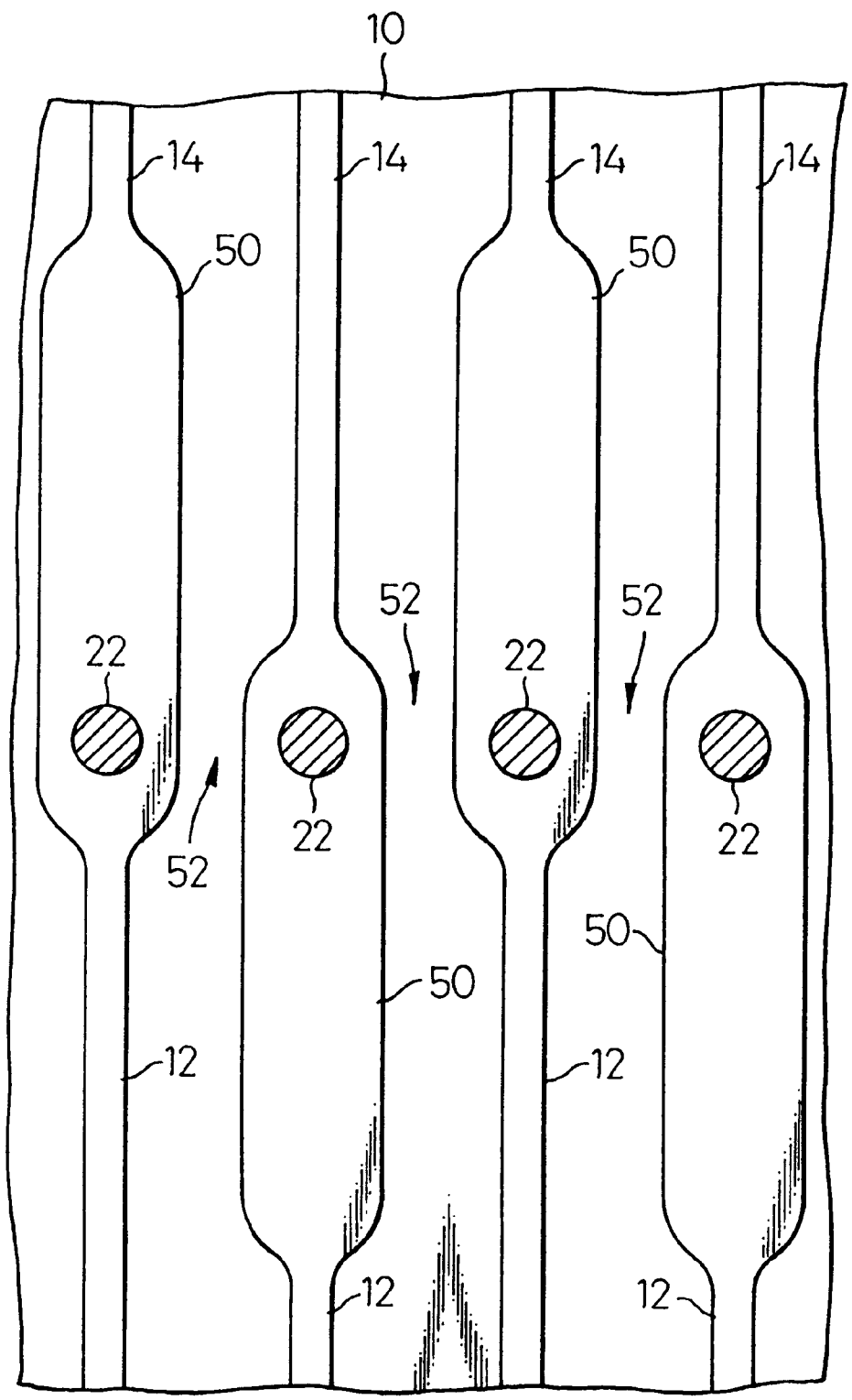
FIG. 1 is an enlarged plan view of part of a substrate according to the present invention.
Figure 2:
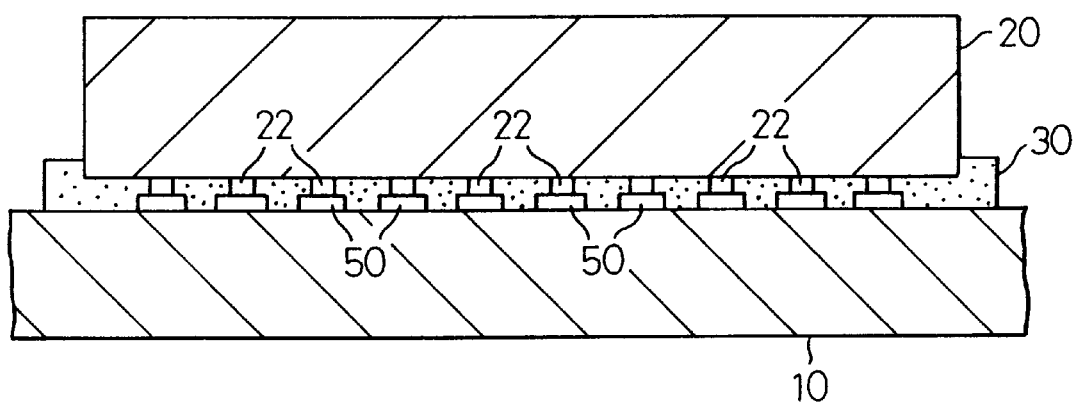
FIG. 2 is a front view of a substrate on which a semiconductor chip is mounted by a resin adhesive.
Figure 3:
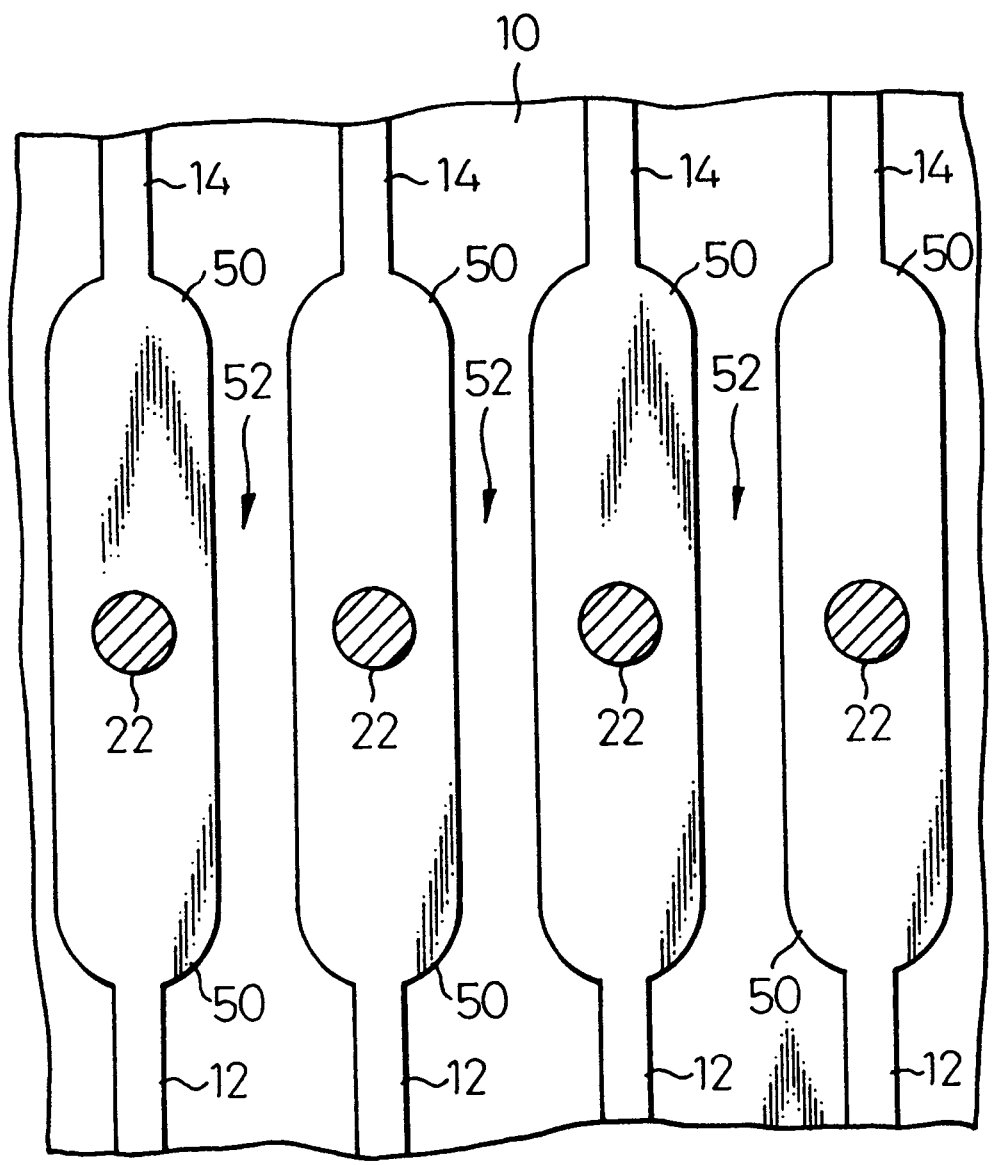
FIG. 3 is a partial enlarged plan view of a substrate known in the prior art.

In the substrate illustrated, a plurality of conductor pads 50 shaped to be widened strips is arranged at a pitch in parallel to each other on a surface of a substrate body 10 made of insulation material such as ceramic or resin for mounting a semiconductor chip 20 thereon, wherein the conductor pads 50 are formed by the metallization or the etching of copper foil.

A plurality of conductor bumps 22 is formed on electrodes arranged on a surface of the semiconductor chip 20 at a predetermined pitch while corresponding to the above-mentioned conductor pads 50 shaped to be widened strips and arranged at a pitch in parallel to each other on the surface of the substrate body 10. The conductor bumps 22 are electrically connected to the corresponding conductor pads 50 via electro-conductive particles contained in a resin of an ACF 30.

Together therewith, the semiconductor chip 20 is bonded to the surface of the substrate body 10 via the resin of the ACF 30.

Thus, the semiconductor chip 20 is mounted onto the surface of the substrate body 10 in a reliable manner not easily stripped off therefrom.

The lower end of the conductor pad 50 continues to a connection line 12 formed on the surface of the substrate body 10. The upper end of the conductor pad 50 continues to a conductor line 14 formed on the surface of the substrate body 10. it is possible to connect a plating electrode (not shown) via the conductor line 14 to the conductor pad 50 and the connection line 12 continuous thereto to carry out an electro-plating of Ni for rust-prevention, or of Au for the surface-finishing on the conductor pad 50 and the connection line 12.

The structure mentioned above is the same as that of the prior art substrate, except that, in the substrate illustrated, the conductor pads 50 shaped to be widened strips and arranged in parallel to each other are alternately shifted in the lengthwise direction of the conductor pad, so that one end portion of one of two adjacent conductor pads 50 is overlapped with the other end portion of the other conductor pad 50 as seen in the widthwise direction of the conductor pad 50 by a distance larger than the width of the conductor bump 22.

In the substrate shown in FIG. 1 structured as above, a length of a narrow gap 52 defined between the portions of the conductor pads 50 overlapped with each other as seen in the widthwise direction could be made much shorter than a half of the longitudinal length of the conductor pad 50. As described before, when the semiconductor chip 20 is bonded to the surface of the substrate body 10 via the resin of the ACF 30, the narrow gap 52 of a shortened length defined between the adjacent conductor pads 50 shaped to be widened strips allows gas generated when the resin of the ACF 30 is heated to smoothly pass therethrough with less resistance. Similarly, air or others left in the interior of the resin and expanding during the heating is also allowed to smoothly pass through the shortened narrow gap defined between the adjacent conductor pads 50 with less resistance. Thus it is possible to prevent voids from being generated anywhere in the resin of the ACF 30 due to the gas and/or air left in the resin of the ACF 30.

Also, it is possible to electrically connect the conductor bumps 22 formed on the respective electrodes arranged on the surface of the semiconductor chip 20 at a predetermined pitch to the corresponding conductor pads 50 in a reliable manner so that the conductive bump 22 is not misaligned with the latter, via the electro-conductive particles contained in the resin of the ACF 30.

According to this substrate, the underfill described above may be used as a resin for bonding the semiconductor chip 20 to the surface of the substrate body 10, which is thermosettable resin flowable into a gap defined between the semiconductor chip 20 and the substrate body 10 and curable by the heating or thermoplastic resin flowable into the gap and hardened by the cooling following the heating. In the case that the underfill or other of thermosettable or thermoplastic resins is used for bonding the semiconductor chip 20 onto the substrate body 10, the narrow gap 52 of a shortened length defined between the adjacent conductor pads 50 shaped to be widened strips allows gas generated when the resin is heated, or air or the like left in the interior of the resin and expanding during the heating, to smoothly pass therethrough with less resistance. Thus, the voids are not generated in the resin of the underfill or others.

In this substrate, the electrical connection is reliably obtainable between the conductor pad 50 and the conductor bump 22, even if the conductor bump 22 formed on the electrode of the semiconductor chip 20 is somewhat deviated from the conductor pad 50 in the lengthwise and/or widthwise direction thereof, because the conductor pad 50 is shaped to be widened strips so that the conductor bump 22 is not off the conductor pad 50.

On the other hand, the connection line 12 continuous to the lower end of the conductor pad 50 and the conductor line 14 continuous to the conductor pad 50 have a width much narrower than a half that of the conductor pad 50.

This is because the connection lines 12 and/or the conductor lines 14 are sufficient to have a function solely for conducting electricity and unnecessary for electrically connect the same with the conductor bump 22 formed on the electrode of the semiconductor chip 20.

Accordingly, a wide space is provided between the adjacent connection lines 12 and/or conductor lines 14 formed on the surface of the substrate body 10 as shown in FIG. 1, and allows gas generating when the resin of the ACF or the underfill is heated, and/or air is left in the interior of the resin of the ACF or the underfill and expanding during the heating, to smoothly pass therethrough with less resistance.

Similarly, a wide space is provided between the connection line 12 and the conductor pad 50 adjacent to each other or between the conductor line 14 and the conductor pad 50 adjacent to each other formed on the surface of the substrate body 10 as shown in FIG. 1, and allows gas generating when the resin of the ACF or the underfill is heated and/or air left in the interior of the resin of the ACF or the underfill and expanding during the heating, to smoothly pass therethrough with less resistance.

As described above, according to the substrate and the semiconductor device of the present invention, when the semiconductor chip is bonded onto the surface of the substrate body via the resin of the ACF or underfill, it is possible to allow gas generated when the resin of the ACF or the underfill is heated, and/or air is left in the interior of the resin and expanded during the heating, to smoothly pass through a shortened narrow gap between the adjacent conductor pads arranged in parallel to each other on the surface of the substrate body with less resistance. Thereby the generation of voids in the interior of the resin of the ACF or underfill is assuredly avoidable. It is also possible to bond the semiconductor chip to the surface of the substrate body in a reliable manner, not to be easily stripped off from the surface of the substrate body. Thus, the favorable electric connection is maintained for a long period between the conductor bump formed on the electrode of the semiconductor chip and the conductor bump formed on the surface of the substrate body.

It should be understood by those skilled in the art that the foregoing description relates to only a preferred embodiment of the disclosed invention, and that various changes and modifications may be made to the invention without departing from the spirit and scope thereof.

What is claimed is:

1. A substrate for mounting a semiconductor chip which is to be bonded to a surface of said substrate via a resin, said substrate comprising:
   a substrate body having a semiconductor chip mounting surface;
   a plurality of conductive lines arranged on said surface so as to extend in a lengthwise direction and spaced substantially in parallel to one another by a predetermined pitch;

each of said conductive lines defining, by a part thereof, a pad portion, a width of which is larger than that of said conductive line, to which a respective electrode of said semiconductor chip is to be electrically connected;

each of said pad portions having first and second opposite ends with respect to a lengthwise direction thereof; and said plurality of pad portions being arranged in such a manner that the first end of one pad portion and the second end of an adjacent pad portion are arranged in a vicinity to each other in a width wise direction.

2. A semiconductor device comprising:

a semiconductor chip having a plurality of electrodes arranged by a predetermined pitch; and a substrate for mounting thereon said semiconductor chip by a resin adhesive; said substrate comprising:

a substrate body having a semiconductor chip mounting surface;

a plurality of conductive lines arranged on said surface so as to extend in a lengthwise direction and spaced substantially in parallel to one another by said predetermined pitch;

each of said conductive lines defining, by a part thereof, a pad portion, a width of which is larger than that of said conductive line, to which a respective electrode of said semiconductor chip is to be electrically connected;

each of said pad portions having a first end and a second opposite end with respect to a lengthwise direction thereof; and said plurality of pad portions being arranged in such a manner that the first end of one pad portion and the second end of an adjacent pad portion are arranged in a vicinity to each other in a width wise direction.

3. A semiconductor device as set forth in claim 2, wherein said resin adhesive is an anisotropic conductive film.

4. A semiconductor device as set forth in claim 2, wherein each of said electrodes of the semiconductor is electrically connected to a respective conductive bump which is bonded to a respective pad on said substrate body by said resin adhesive.

* * * * *

UNITED STATES PATENT AND TRADEMARK OFFICE
CERTIFICATE OF CORRECTION

PATENT NO. : 6,281,567 B1
DATED : August 28, 2001
INVENTOR(S) : Kei Murayama et al It is certified that error appears in the above-identified patent and that said Letters Patent is hereby corrected as shown below:

Column 6, line 59 through column 8, line 19, please replace each of claims 1, 2 and 4 with the following:

1. A substrate for mounting a semiconductor chip which is to be bonded to a surface of said substrate via a resin, said substrate comprising:
a substrate body having a semiconductor chip mounting surface with a length and a width;
a plurality of conductive lines arranged on said surface so as to extend along the length of the surface in spaced, substantially parallel relationship to one another by a predetermined pitch;
each of said conductive lines has at least one first portion with a first substantially continuous width, and a second portion having a length and a second substantially continuous width larger than the first width, to which a respective electrode of said semiconductor chip is electrically connected;
each of said second portions having first and second opposite ends with respect to the length thereof;
said plurality of conductive lines being arranged in such a manner that the first end of one of the second portions and the second end of another of the second portions are arranged directly adjacent to each other, along the width of the surface, and extending across a line perpendicular to the length of the surface, such that a space between the adjacent first and second ends of the second portions is less than a space between one of the second portions and an adjacent first portion, and
conductive bumps formed between the semiconductor chip and the conductor pads,
wherein the conductor bumps are arranged at the perpendicular line.

2. A semiconductor device comprising:
a semiconductor chip having a plurality of electrodes arranged by a predetermined
pitch; and a substrate for mounting thereon said semiconductor chip by a resin adhesive; said substrate comprising:
a substrate body having a semiconductor chip mounting surface with a length and a width;

Signed and Sealed this

Twenty-first Day of May, 2002

JAMES E. ROGAN
Director of the United States Patent and Trademark Office

UNITED STATES PATENT AND TRADEMARK OFFICE
CERTIFICATE OF CORRECTION

PATENT NO.     : 6,281,567 B1
DATED          : August 28, 2001
INVENTOR(S)    : Kei Murayama et al It is certified that error appears in the above-identified patent and that said Letters Patent is hereby corrected as shown below:

Column 6, line 59 through column 8, line 19, please replace each of claims 1, 2 and 4 with the following:

1. A substrate for mounting a semiconductor chip which is to be bonded to a surface of said substrate via a resin, said substrate comprising:
   a substrate body having a semiconductor chip mounting surface with a length and a width;
   a plurality of conductive lines arranged on said surface so as to extend along the length of the surface in spaced, substantially parallel relationship to one another by a predetermined pitch;
   each of said conductive lines has at least one first portion with a first substantially continuous width, and a second portion having a length and a second substantially continuous width larger than the first width, to which a respective electrode of said semiconductor chip is electrically connected;
   each of said second portions having first and second opposite ends with respect to the length thereof;
   said plurality of conductive lines being arranged in such a manner that the first end of one of the second portions and the second end of another of the second portions are arranged directly adjacent to each other, along the width of the surface, and extending across a line perpendicular to the length of the surface, such that a space between the adjacent first and second ends of the second portions is less than a space between one of the second portions and an adjacent first portion , and
   conductive bumps formed between the semiconductor chip and the conductor pads,
   wherein the conductor bumps are arranged at the perpendicular line.

2. A semiconductor device comprising:
   a semiconductor chip having a plurality of electrodes arranged by a predetermined
   pitch; and a substrate for mounting thereon said semiconductor chip by a resin adhesive; said substrate comprising:
   a substrate body having a semiconductor chip mounting surface with a length and a width;
      a plurality of conductive lines arranged on said surface so as to extend along the length of the surface in spaced, substantially parallel relationship to one another by said predetermined pitch;
   each of said conductive lines has at least one first portion with a substantially continuous width, and a second portion having a length and a width larger than the first width, to which a respective electrode of said semiconductor chip is electrically connected;
   each of said second portions having a first end and a second opposite end with respect to the length thereof;
   said plurality of conductive lines being arranged in such a manner that the first end of one of the second portions and the second end of another of the second portions are arranged directly adjacent to each other, along the width of the surface, and extending across a line perpendicular to the length of the surface, such that a space between the adjacent first and
   second ends of the second portions is less than a space between one of the second portions and an adjacent first portion; and
   conductive bumps formed between the semiconductor chip and the conductor pads, wherein the conductor bumps are arranged at the perpendicular line.

UNITED STATES PATENT AND TRADEMARK OFFICE
CERTIFICATE OF CORRECTION

PATENT NO. : 6,281,567 B1
DATED : August 28, 2001
INVENTOR(S) : Kei Murayama et al It is certified that error appears in the above-identified patent and that said Letters Patent is hereby corrected as shown below:

4.    A semiconductor device as set forth in claim 2, wherein each of said electrodes of the semiconductor is electrically connected to a respective one of the conductive bumps which is bonded to a respective pad on said substrate body by said resin adhesive.

This certificate supersedes the Certificate of Correction issued May 21, 2002.

Signed and Sealed this

Seventh Day of January, 2003

JAMES E. ROGAN
*Director of the United States Patent and Trademark Office*